TUNING SYSTEM

Filed Aug. 11, 1950

Inventor:
Raymond J. Witkowski,
by Merton D. Moore
His Attorney.

Patented Aug. 4, 1953

2,648,007

UNITED STATES PATENT OFFICE 2,648,007

TUNING SYSTEM

Raymond J. Witkowski, Syracuse, N. Y., assignor to General Electric Company, a corporation of New York Application August 11, 1950, Serial No. 178,888

3 Claims. (Cl. 250—36)

Figures 1, 2:
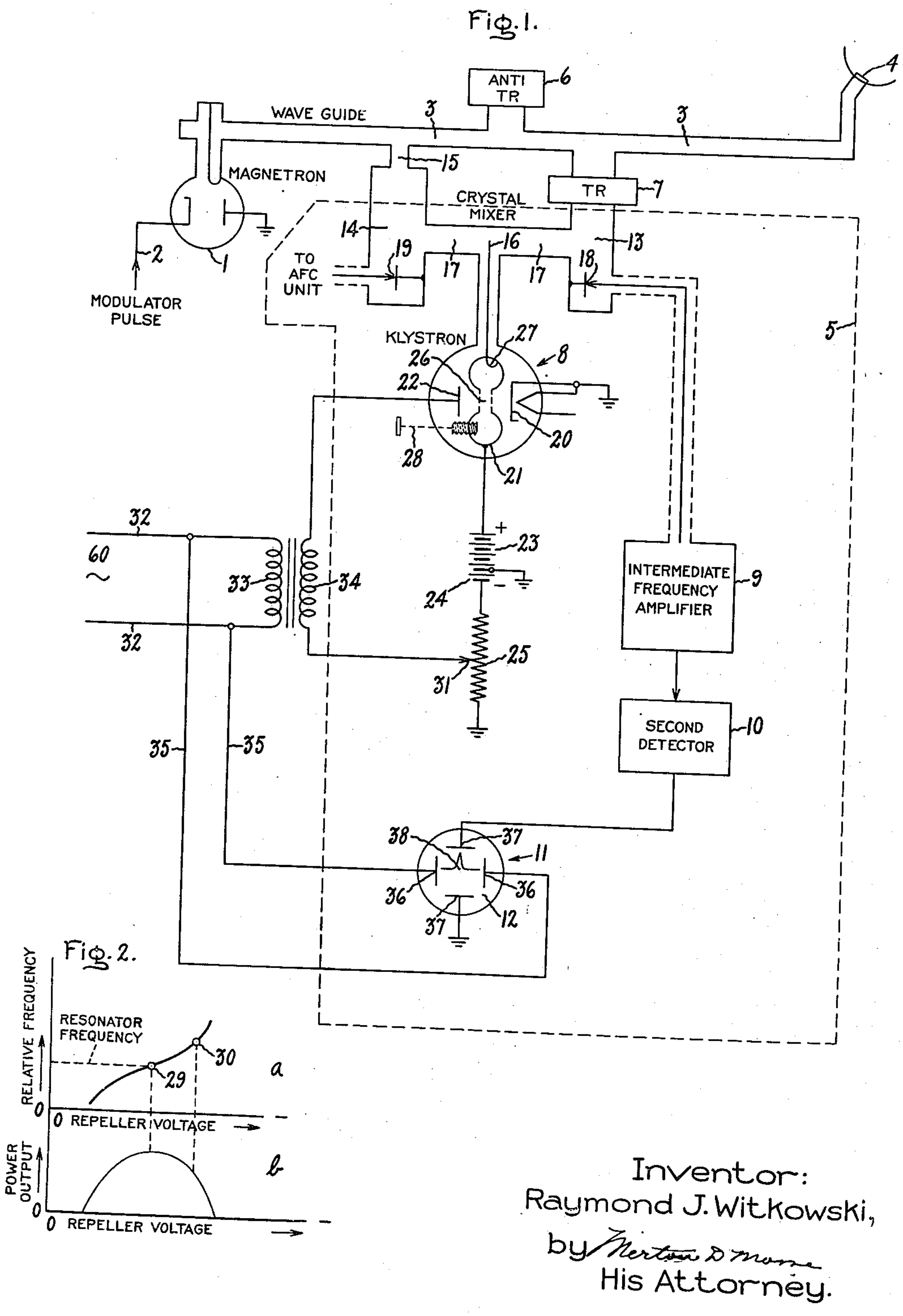

This invention relates to the turning of frequency determining electrical circuits and particularly to the type capable of being tuned over a given range of frequencies under the control of an applied electrical signal.

In the communication of ultra-high frequency electrical waves, the problem of continuously maintaining the communication system in proper tuning despite the occurrence of certain inherent associated circuit instabilities has been a difficult one. For example, a particular tuning difficulty exists in the case of radar obstacle detection where the received echo pulses, indicative of detected obstacles, are passed through a fixed tuned intermediate frequency amplifier stage before being applied to an indicator. Because of rapid frequency instabilities in the radar transmitter, it becomes necessary automatically to control the frequency of the local oscillator waves such that upon heterodyning with the waves of the received echo pulses, a constant intermediate frequency is maintained. Variations in the intermediate frequency from the desired value result in a reduced or even zero output from the fixed tuned intermediate frequency stages and, hence, have a direct bearing on the effectiveness of the detection systm. A commonly used source of local oscillator waves has been the klystron electron discharge device, particularly of the reflex type. The frequency of operation of a reflex klystron is determined primarily by the resonant frequency of the resonator, but can be controlled over a range of the order of magnitude of 1% by varying its repeller voltage. It is this varying of the repeller voltage permitting fine tuning of the local oscillator waves that lends the klystron readily to rapid acting automatic frequency control schemes such as are employed in radar systems.

As is well known, tuning of the reflex klystron to provide a particular oscillator output frequency is obtained by first adjusting the klystron resonator dimensions mechanically as, for example, by tuning struts, to approximately the desired frequency, and then varying the repeller voltage to provide the fine tuning to the exact frequency. Unfortunately, the output of the klystron oscillator is affected considerably more than the frequency by changes in the repeller voltage. Therefore, it is important to change the volume of the resonator cavity to deliver substantially the oscillator frequency desired and to employ narrow range variations of the repeller voltage to provide the minor adjustments of frequency to the desired value. The task of providing optimum tuning of the klystron oscillator is further complicated by certain inherent frequency instabilities. For example, under certain conditions it will be found that for certain adjustments the oscillator may generate either of two frequencies differing considerably in value. This phenomenon is known as mode interference and arises as a result of the resonator being simultaneously resonant at a number of frequencies. Furthermore, discontinuities in the operating frequency range, referred to as blind spots, may occur as the result of parasitic resonances. The effect of these is to prevent oscillation under certain conditions over a very narrow frequency range. Under other conditions two possible frequencies of oscillation exist for a given repeller voltage, causing the frequency to jump as the tuning of the repeller voltage is changed. Previous tuning indicators have been unable to detect and assist in resolving these difficulties rapidly enough. Where a number of klystron circuits must be tuned either to the same or different frequencies, a more rapid tuning indicator is desirable.

It is an object of my invention to provide improved means for facilitating tuning of a frequency controlling circuit.

Another object of my invention is to provide improved means for facilitating tuning an electrical frequency determining circuit capable of being tuned in response to an applied signal.

Another object of my invention is to provide improved means for indicating proper tuning of a klystron oscillator circuit.

A still further object of my invention is to provide improved means for indicating a desired tuning of the reflex klystron local oscillator employed in radar receiving circuits.

A still further object of my invention is to provide improved means for facilitating adjustment of the repeller voltage of a klystron oscillator with respect to the resonator tuning to provide satisfactory operation over a given range of output frequencies.

In accordance with a preferred embodiment of the invention, applicable to radar receiving systems, means are provided for facilitating tuning the klystron local oscillator to insure a desired frequency of the intermediate frequency waves resulting from heterodyning the local oscillator waves with the received radar pulses. To determine the optimum tuning of the reflex klystron, bearing the above enumerated difficulties in mind, an alternating potential is superimposed on the normally negative unidirectional potential applied to the repeller electrode of the klystron for sweeping the frequency of the klystron over a given range. To facilitate rapid tuning of the klystron circuit a cathode ray tube indicator is employed. The alternating potential employed in sweeping the klystron output frequency is applied to the cathode ray tube indicator to control the ray deflection in one coordinate while the output of the intermediate frequency amplifier is employed to control the cathode ray in another coordinate. Thus, there is displayed on the screen of the cathode ray tube the time occurrence of the intermediate frequency output with respect to the instantaneous amplitude of the combined repeller voltages. By adjusting the value of the unidirectional repeller voltage and a mechanical tuning element in the klystron when necessary, the pass band of the intermediate frequency amplifier may be centered on the screen of the oscilloscope. This corresponds to the zero voltage amplitude of the alternating potential and hence, constitutes a desired tuning of the klystron with respect to the received signals.

Novel features which I believe characteristic of my invention are set forth with particularity in the appended claims. My invention, however, both as to its organization and method of operation together with further objects and advantages thereof may best be understood by reference to the following description taken in connection with the accompanying drawings in which Fig. 1 shows in diagrammatic form a preferred embodiment of the invention as applied to reflex klystron local oscillator tuning in radar detection and Fig. 2 illustrates graphically the relationship between variation in frequency and magnitude of output with variation in the repeller potential.

The curve *a* of Fig. 2 shows the relation between repeller voltage in a klystron, plotted as abscissae, and frequency plotted as ordinates. This curve indicates that variation of the oscillation frequency of a reflex klystron local oscillator is somewhat linear with change in the repeller voltage over a considerable region. If the tuning of the klystron cavity resonator is changed by mechanical means such as a tuning strut, to set the oscillator frequency at a proper value to provide a desired intermediate frequency for optimum circuit operation, then any changes in the frequency of input waves may be compensated for by adjusting the repeller voltage in either direction from this optimum frequency point to maintain the constant intermediate frequency.

Since for a particular resonant frequency of the klystron resonator, the characteristic shown in graph *a* of Fig. 2 departs rapidly from linearity at either end, it is desirable in setting up the klystron local oscillator for operation in a radar receiving arrangement to establish a normal repeller voltage at a point such as 29, such that variations in either direction from this point will result in a sufficient tuning range of the klystron oscillator to insure proper automatic frequency control operation. In the event the klystron local oscillator is so adjusted that the normal repeller voltage point occurred at 30, it is seen that although a sufficient range of tuning exists in the less negative repeller voltage direction, very little tuning adjustment is possible in the increasing negative repeller voltage direction. Even more important, in view of the falling off in energy output as a result of operating away from the resonator tuning, shown in *b* of Fig. 2, it is necessary to limit repeller voltage variations to a relatively narrow range. The curve of Fig. 2 shows the power output of the klystron, plotted as ordinates, and repeller voltage plotted as abscissae.

Applicant's arrangement as disclosed in Fig. 1 is capable of providing information to insure rapid adjustment of klystron oscillator to the desired optimum tuning condition while requiring a minimum of additional circuit components.

Referring to Fig. 1 there is disclosed an obstacle detection system comprising the magnetron 1 for generating ultra-high frequency energy under the control of modulator pulses available over lead 2 for transmission down the wave guide 3 to a transmitting and receiving antenna 4. The transmitted radar pulse after reradiation from a target is received by the antenna 4 and applied over the wave guide to the radar receiver 5. Since the transmitter, comprising the magnetron circuit 1, and the receiver 5 utilize the same wave guide transmission line 3 and antenna 4, a duplexing arrangement comprising a so-called anti-TR box 6 and a TR box 7 is employed to direct both the transmitted and received power to the proper destination. These TR and anti-TR boxes are widely employed in radar detection schemes and essentially comprise spark gap or gas discharge devices operating effectively as switches in response to the relatively high transmitted power. These boxes are so positioned in the respective paths to the receiver and transmitter that upon transmission of a radar pulse, the gaps or gaseous discharge paths are made conductive effectively to render a low impedance path from the transmitter to the antenna 4 while blocking transfer of the transmitted power to the receiver. At the end of the transmitted pulse, the gaps or gaseous paths are rendered non-conductive such that there no longer exists a path to the transmitter for the received reflected energy of relatively low power, whereas the path to the receiver is unblocked.

As is well known, the radar receiver 5 employs a klystron 8 as a source of local oscillations for mixing with the reflected received energy. The resultant intermediate frequency waves are applied through the amplifier stage 9, detected in 10, and applied to a cathode ray oscilloscope 11 for display purposes.

The particular receiver indicated in Fig. 1 is of a type that employs a double mixing stage, the first stage comprising the wave guide section 13 for the regular channel with received signal input through the TR box 7 to the amplifying and indicating stages, and a second stage comprising the wave guide section 14 with transmitted signal input through an attenuator 15 comprising a constriction in the wave guide coupling, for the automatic frequency control channel. Both of these stages obtain their local oscillator power from the same klystron 8.

Output from the klystron local oscillator 8 is applied by means of probe 16 and the wave guide section 17 to the wave guide sections 13 and 14 for mixing with the received reflected energy and a portion of the transmitted energy, respectively, in crystal mixers 18 and 19. The resultant intermediate frequency energy available at crystal 18 is normally applied through the receiver amplifying, detecting and indicating channels for displaying the radar pulse whereas the output of crystal 19 is normally applied to an automatic frequency control circuit which adjusts the tuning of the klystron oscillator to maintain a constant intermediate frequency output.

The nature of the automatic frequency control circuit is well known in the art and since it forms no part of the present invention, its specific details are omitted. It is sufficient to say that the automatic frequency control circuit effects its control by mechanical tuning of the resonator of the klystron or by adjusting the repeller electrode voltage. The details of these tuning components of the klystron oscillator circuit will be discussed in detail shortly.

The klystron type of local oscillator shown in Fig. 1 is of the conventional reflex type comprising a cathode 20, a coaxial line or reentrant type cavity resonator 21, which also serves as an anode, and a repeller or reflector electrode 22. The cathode 20 is maintained at ground potential, the anode 21 at a positive potential with respect to the cathode by means of battery 23, and electrode 22 at a moderate negative potential by means of battery 24 and adjustable resistor 25. Electrons leaving the cathode 20 are beamed through the gap 26 in the resonator 21 and travel toward the repeller 22. The repeller electrode 22 having a negative potential with respect to the cathode, turns the electrons back toward the anode where they pass through the anode gap 26 a second time. A proper adjustment of the negative voltage on the repeller electrode 22 insures that the electrons which have passed through the gap 26 on their way to the repeller may be made to pass through the gap again upon reflection from the repeller electrode at the proper time to deliver electromagnetic energy to the resonator 21. Energy is coupled out of the cavity resonator 21 by a coupling loop 27.

Let it be assumed that the voltage at the repeller electrode 22 is preset at some value by the movable tap 31 and that an alternating potential, such as the 60 cycle alternating potential as indicated on the drawing, is applied over leads 32 to the primary winding of transformer 33. The secondary winding 34 of this transformer is connected in the negative potential energizing circuit for the repeller electrode and effectively superimposes the alternating potential on the negative potential normally available at the movable tap 31. The alternating potential superimposed on the normal repeller voltage effects a sweeping of the tuning of the klystron over a given range in accordance with the frequency output versus repeller voltage curve of the reflex klystron. In the event the normal repeller voltage bias obtainable from resistor 25 is established at the center of the substantially linear region of this curve, then the alternating potential sweeps the klystron output frequency equally in either direction over a range corresponding to the amplitude of the applied alternating potential.

The alternating potential available at leads 32 is also applied over leads 35 to the horizontal deflection elements 36 of the cathode ray oscilloscope 11. This potential is effective in synchronously sweeping the electron ray of the oscilloscope in the horizontal direction across the screen of the cathode ray oscilloscope.

The cyclically varying klystron oscillator frequency is mixed with an applied signal which may be a portion of the transmitted pulse, resultant echo, or the returns from an echo box connected to the antenna 4, and after passage through the intermediate frequency amplifier 9 is detected in 10 and applied to the vertical deflection elements 37 of the oscilloscope 11. Application of the detected output to elements 37 effects a vertical modulation of the electron ray on the screen of the cathode ray oscilloscope. Since the intermediate frequency amplifier is pretuned to a given frequency, its resultant output, with local oscillator frequency sweeps, is displayed on the screen 12 of the oscilloscope in the form of a horizontal trace having a narrow, raised portion in the vicinity of a central reference point 38 of screen 12 which is related to the optimum operating point 29 of curve "*a*" in Fig. 2. That is, the fixed pass band of the amplifier 9 provides an output pulse at the output of detector 10 which is timed according to the value of the unidirectional repeller voltage from tap 31 with respect to the sweep tuning of the klystron, and hence with respect to the alternating deflection potential applied across the horizontal deflection elements 26. If the pulse is displayed on the screen 12 displaced to the right of point 38, this indicates that the normal bias of the repeller electrode is displaced from the optimum point resulting in a reduced output in accordance with the power output versus repeller voltages curve of the klystron oscillator, and that the alternating sweep potential is effective in sweeping a smaller range in the more negative repeller voltage direction than in the less negative direction of Fig. 2. By adjusting the movable tap 31 in the correct direction, the pulse may be moved in the direction of coincidence with the optimum point 38. It should be remembered that at point 38 the alternating potential passes through its zero amplitude value, and hence only the potential obtained from resistor 25 is impressed on the repeller electrode 22. Thus by adjusting the tap 31, while observing the position of the intermediate frequency amplifier output pulse and bringing the pulse to the center of the screen of the oscilloscope to bring the pulse and the zero point on the sweep potential wave into time coincidence, the normal unidirectional repeller voltage may be established at the optimum operating point represented by numeral 29 in Fig. 2.

In accomplishing this tuning of the klystron oscillator, it is noted that all of the conventional, major receiving circuit components have been retained including the amplifier 9, second detector 10 and cathode ray tube indicator 11. Also the proposed arrangement eliminates the use of additional reflex klystron circuits, and probes, employed in the conventional tuning systems, that may modify the normal radar local oscillator operation. Applicant's arrangement has the advantage of being simple, and inexpensive while providing a method of tuning which is reliable and rapid.

While the invention has been disclosed in the form of a preferred embodiment applicable to klystron tuning circuits it readily lends itself to operation with any frequency determining circuit which is capable of tuning over a given frequency range under the control of electrical signals.

While a specific embodiment has been shown and described it will, of course, be understood that various modifications may be made without departing from the invention. The appended claims are, therefore intended to cover any such modifications within the true spirit and scope of the invention.

What I claim as new and desire to secure by Letters Patent of the United States is:

1. In combination, a reflex klystron oscillator for generating electrical waves, said oscillator comprising a repeller electrode and a cathode, a cathode-repeller electrode circuit for said oscillator, a source of unidirectional potential of adjustable amplitude coupled to said circuit, a source of electrical waves, an intermediate frequency channel, means for mixing the waves from said oscillator and said source to provide intermediate frequency waves, means for applying said intermediate frequency waves to said channel, a source of sweep potential coupled to said circuit for superimposing a sweep potential on said unidirectional potential for sweeping the frequency of said oscillator over a given range, a two coordinate display indicator, means for providing an indication in one coordinate of said indicator in accordance with the instantaneous amplitude of said sweep potential, means for providing an indication in the other coordinate of said indicator in accordance with the output of said intermediate frequency channel so that said unidirectional potential may be adjusted to position said channel indication along said sweep indication.

2. In an arrangement comprising a reflex klystron employed as a generator of local oscillations for mixing with received waves before application to a fixed tuned intermediate frequency channel, means for indicating adjustment of the repeller-to-cathode voltage of the klystron relative to a preset value on the klystron frequency output versus repeller-to-cathode voltage characteristic comprising a sweep voltage source, a cathode ray tube including a viewing screen, an electron gun providing an electron beam directed toward said screen, and two sets of deflection elements for controlling the position at which said beam impinges upon said screen in two quadrature related coordinates, a repeller-cathode circuit for said klystron, means for concurrently applying said sweep voltage to said circuit to sweep the frequency of said generator over a given range and to one of said deflection elements for deflecting said beam in one coordinate, means for applying the output of said intermediate frequency channel to said other deflection element to deflect said beam in the other coordinate, and a source of unidirectional potential of adjustable amplitude coupled to said circuit for providing a repeller-to-cathode voltage of such magnitude that said sweep voltage sweeps the frequency of said oscillator through a range producing an output signal from said channel represented by a display on said screen having a predetermined position relative to a reference point on said screen.

3. In combination, an arrangement comprising a reflex klystron oscillator having a repeller electrode, said oscillator being tunable in frequency under control of a unidirectional potential applied to said repeller electrode, means for mixing the oscillator waves with waves of another frequency to derive intermediate frequency waves, and a fixed tuned intermediate frequency channel for amplifying said intermediate frequency waves; and means to facilitate the adjustment of said unidirectional potential to provide an output frequency from said oscillator resulting, after mixing, in intermediate frequency waves of a frequency substantially the same as the tuned frequency of said intermediate frequency channel comprising means for superimposing a sweep voltage on said unidirectional potential to sweep the output frequency of said oscillator cyclically over a given range from that afforded by said unidirectional potential, means for indicating the time position of intermediate frequency waves passed by said intermediate frequency channel relative to a time position on said sweep voltage at which said sweep voltage is zero, and means for adjusting said unidirectional potential to provide time coincidence of said two time positions.

RAYMOND J. WITKOWSKI.

References Cited in the file of this patent

UNITED STATES PATENTS

| Number | Name | Date |
|---|---|---|
| 2,269,126 | Pieracci | Jan. 6, 1942 |
| 2,324,915 | Dow | July 20, 1943 |
| 2,471,432 | Jaggi | May 31, 1949 |

OTHER REFERENCES

Gaffney, abstract of application Serial No. 639,645, pub. May 23, 1950, in 634 O. G. 1305.